United States Patent
Stumpf et al.

(10) Patent No.: US 11,509,751 B2
(45) Date of Patent: Nov. 22, 2022

(54) SELF-DESCRIBING SYSTEM USING SINGLE-SOURCE/MULTI-DESTINATION CABLE

(71) Applicant: Dell Products L.P., Round Rock, TX (US)

(72) Inventors: Michael J. Stumpf, Cedar Park, TX (US); Jeffrey L. Kennedy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/132,905

(22) Filed: Dec. 23, 2020

(65) Prior Publication Data

US 2022/0201104 A1    Jun. 23, 2022

(51) Int. Cl.
| | | |
|---|---|---|
| *H04L 69/24* | (2022.01) | |
| *H04L 69/22* | (2022.01) | |
| *G01R 27/02* | (2006.01) | |
| *H04B 3/14* | (2006.01) | |
| *H04L 69/00* | (2022.01) | |

(52) U.S. Cl.
CPC ............. *H04L 69/24* (2013.01); *G01R 27/02* (2013.01); *H04B 3/145* (2013.01); *H04L 69/22* (2013.01); *H04L 69/26* (2013.01)

(58) Field of Classification Search
CPC ......... H04L 69/24; H04L 69/22; H04L 69/26; H04B 3/145; G01R 27/02
See application file for complete search history.

(56) References Cited

U.S. PATENT DOCUMENTS

| | | | |
|---|---|---|---|
| 9,203,730 B1 * | 12/2015 | Johnson | H04L 43/50 |
| 11,086,813 B1 * | 8/2021 | Schuette | G06F 13/1668 |
| 11,349,965 B1 | 5/2022 | Xu et al. | |
| 2005/0088445 A1 * | 4/2005 | Gonzalez | G06F 3/1438 710/100 |
| 2011/0185103 A1 * | 7/2011 | Evoy | G06F 13/4282 710/305 |
| 2012/0265912 A1 * | 10/2012 | Hess | G06F 13/126 710/301 |
| 2013/0151750 A1 * | 6/2013 | Kanigicherla | G06F 13/4022 710/313 |
| 2013/0286864 A1 * | 10/2013 | Karam | H04L 43/10 370/252 |
| 2014/0244889 A1 * | 8/2014 | Sasson | G06F 13/4022 710/316 |
| 2015/0055663 A1 * | 2/2015 | Quinn | H04B 10/801 398/43 |
| 2016/0352651 A1 * | 12/2016 | Egi | H04L 49/15 |
| 2017/0031863 A1 * | 2/2017 | Glaser | G06F 1/12 |

(Continued)

*Primary Examiner* — Blake J Rubin
(74) *Attorney, Agent, or Firm* — Jackson Walker L.L.P.

(57) ABSTRACT

An information handling system may include a plurality of communication destinations, a communication source, a single-source/multi-destination cable having a plurality of branches, each branch communicatively coupling the communication source to a communication destination respective to such branch, and a logic device communicatively coupled to the communication source and the single-source/multi-destination cable and configured to communicate to each of the plurality of branches both analog source identifying information and digital source identifying information regarding the communication source.

21 Claims, 3 Drawing Sheets

(56) References Cited

U.S. PATENT DOCUMENTS

| | | | | |
|---|---|---|---|---|
| 2017/0222726 A1* | 8/2017 | Kubo | ................... | H04B 10/504 |
| 2017/0286352 A1* | 10/2017 | Kumar | ................ | G06F 13/4022 |
| 2017/0322899 A1* | 11/2017 | Ni | ....................... | G06F 13/4022 |
| 2017/0351626 A1* | 12/2017 | Lalam | ................. | G06F 13/1694 |
| 2018/0004273 A1* | 1/2018 | Leucht-Roth | ......... | G06F 1/3209 |
| 2018/0088639 A1* | 3/2018 | Remis | ................ | G06F 9/44505 |
| 2018/0143932 A1* | 5/2018 | Lawless | .............. | G06F 13/4068 |
| 2018/0275905 A1* | 9/2018 | Olarig | ................. | G06F 13/4063 |
| 2018/0285307 A1* | 10/2018 | Willis | ................. | G06F 13/4234 |
| 2019/0034372 A1* | 1/2019 | Blevins | .............. | G06F 13/4291 |
| 2019/0042510 A1* | 2/2019 | Ngau | .................. | G06F 13/4282 |
| 2019/0114281 A1* | 4/2019 | Li | ....................... | G06F 13/4027 |
| 2019/0158430 A1* | 5/2019 | Pierson | ................. | H04W 28/14 |
| 2019/0238179 A1* | 8/2019 | Iyer | ......................... | G06F 13/20 |
| 2019/0280411 A1* | 9/2019 | Olarig | ................. | H01R 43/205 |
| 2019/0303315 A1* | 10/2019 | Shih | ..................... | G06F 13/102 |
| 2019/0369703 A1* | 12/2019 | Tan | ....................... | G06F 3/0625 |
| 2020/0097431 A1* | 3/2020 | Wang | ........................ | G06F 1/20 |
| 2020/0162406 A1* | 5/2020 | Goh | ........................ | H04L 47/12 |
| 2020/0212943 A1* | 7/2020 | Banin | ..................... | H04B 1/04 |
| 2020/0278733 A1* | 9/2020 | Li | ....................... | G06F 13/4295 |
| 2020/0301618 A1* | 9/2020 | Olarig | ................. | G06F 3/0635 |
| 2021/0234716 A1* | 7/2021 | Mcgraw | ............. | H04L 12/1854 |
| 2021/0383879 A1* | 12/2021 | Lin | ........................ | G11C 16/26 |
| 2021/0406206 A1* | 12/2021 | Vergis | ................ | G06F 13/1668 |

\* cited by examiner

SELF-DESCRIBING SYSTEM USING SINGLE-SOURCE/MULTI-DESTINATION CABLE

TECHNICAL FIELD

The present disclosure relates in general to information handling systems, and more particularly to methods and systems for identifying all couplings of a single-source/multi-destination cable by a system management entity in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Solid state drives, such as Non-Volatile Memory Enhanced (NVMe) devices, may be coupled to an input/output (I/O) backplane which may in turn be coupled to a motherboard via a Peripheral Component Interconnect Enhanced (PCIe) cable. In some instances, such a cable may include a single-source/multi-destination cable (also known as a Y cable). However, under existing approaches, multi-destination cable couplings may be limited to hard-coded table of lane mappings and limited to symmetric bifurcations. In other words, using existing approaches, both destinations of a two-destination cable must have the same bifurcation requirements because they share the same source. For example, if a single x16 source has a first destination requiring a single x8 link and a second destination requiring four x2 links, the two destinations may be incapable of sharing the same source because each destination may corrupt the analog voltage detected at the source. In addition, each destination may be incapable of detecting which eight lanes of the source to which it is coupled.

SUMMARY

In accordance with the teachings of the present disclosure, the disadvantages and problems associated with existing approaches to detecting connectivity in a system comprising a single-source/multiple-destination cable may be reduced or eliminated.

In accordance with embodiments of the present disclosure, an information handling system may include a plurality of communication destinations, a communication source, a single-source/multi-destination cable having a plurality of branches, each branch communicatively coupling the communication source to a communication destination respective to such branch, and a logic device communicatively coupled to the communication source and the single-source/multi-destination cable and configured to communicate to each of the plurality of branches both analog source identifying information and digital source identifying information regarding the communication source.

In accordance with these and other embodiments of the present disclosure, a method may include, in an information handling system having a plurality of communication destinations, a communication source, and a single-source/multi-destination cable having a plurality of branches, each branch communicatively coupling the communication source to a communication destination respective to such branch: communicating to each of the plurality of branches both analog source identifying information and digital source identifying information regarding the communication source.

In accordance with these and other embodiments of the present disclosure, an article of manufacture may include a non-transitory computer-readable medium and computer-executable instructions carried on the computer-readable medium, the instructions readable by a processing device, the instructions, when read and executed, for causing the processing device to, in an information handling system having a plurality of communication destinations, a communication source, and a single-source/multi-destination cable having a plurality of branches, each branch communicatively coupling the communication source to a communication destination respective to such branch: communicate to each of the plurality of branches both analog source identifying information and digital source identifying information regarding the communication source.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
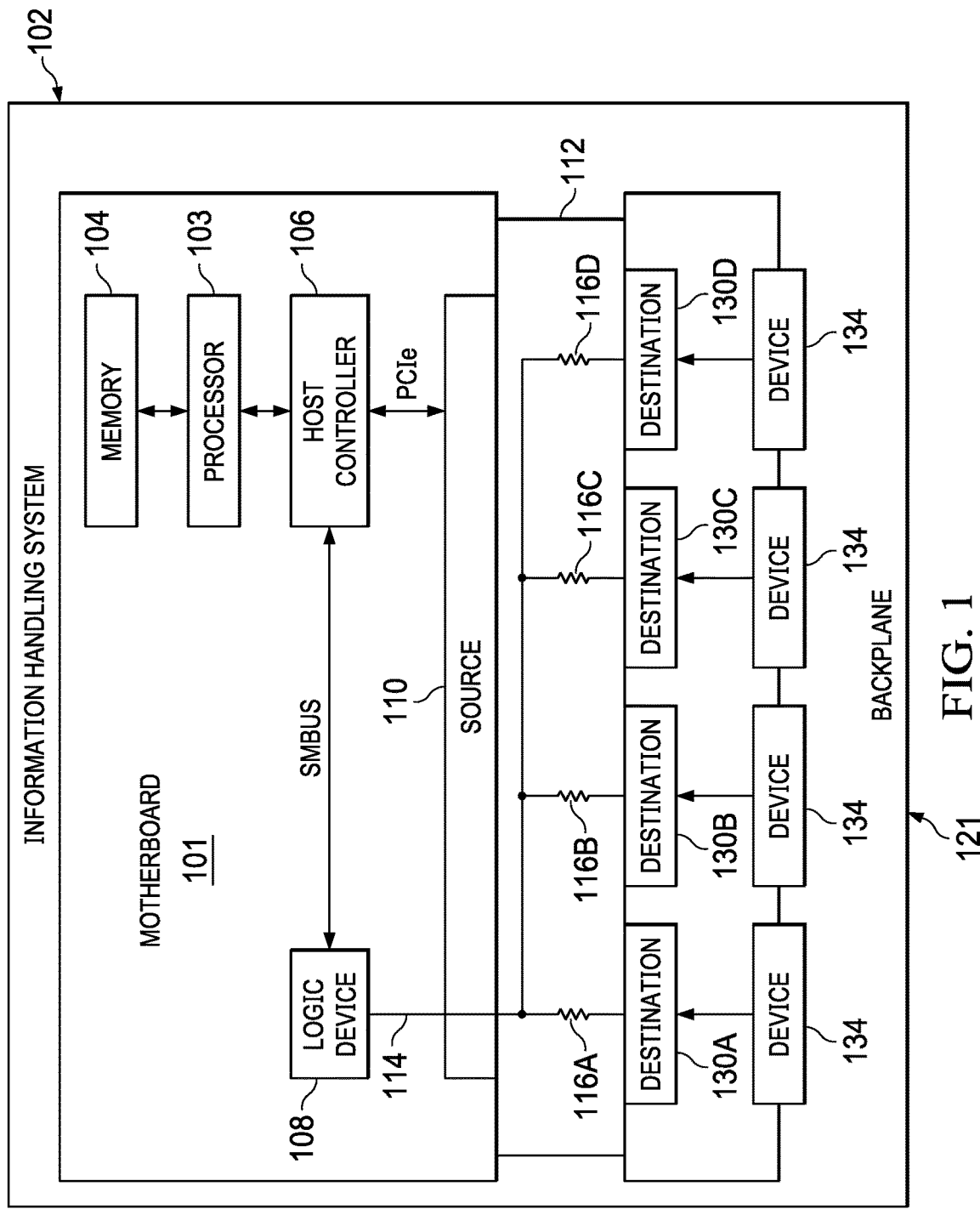
FIG. 1 illustrates a block diagram of an example information handling system, in accordance with embodiments of the present disclosure.
Figure 2:
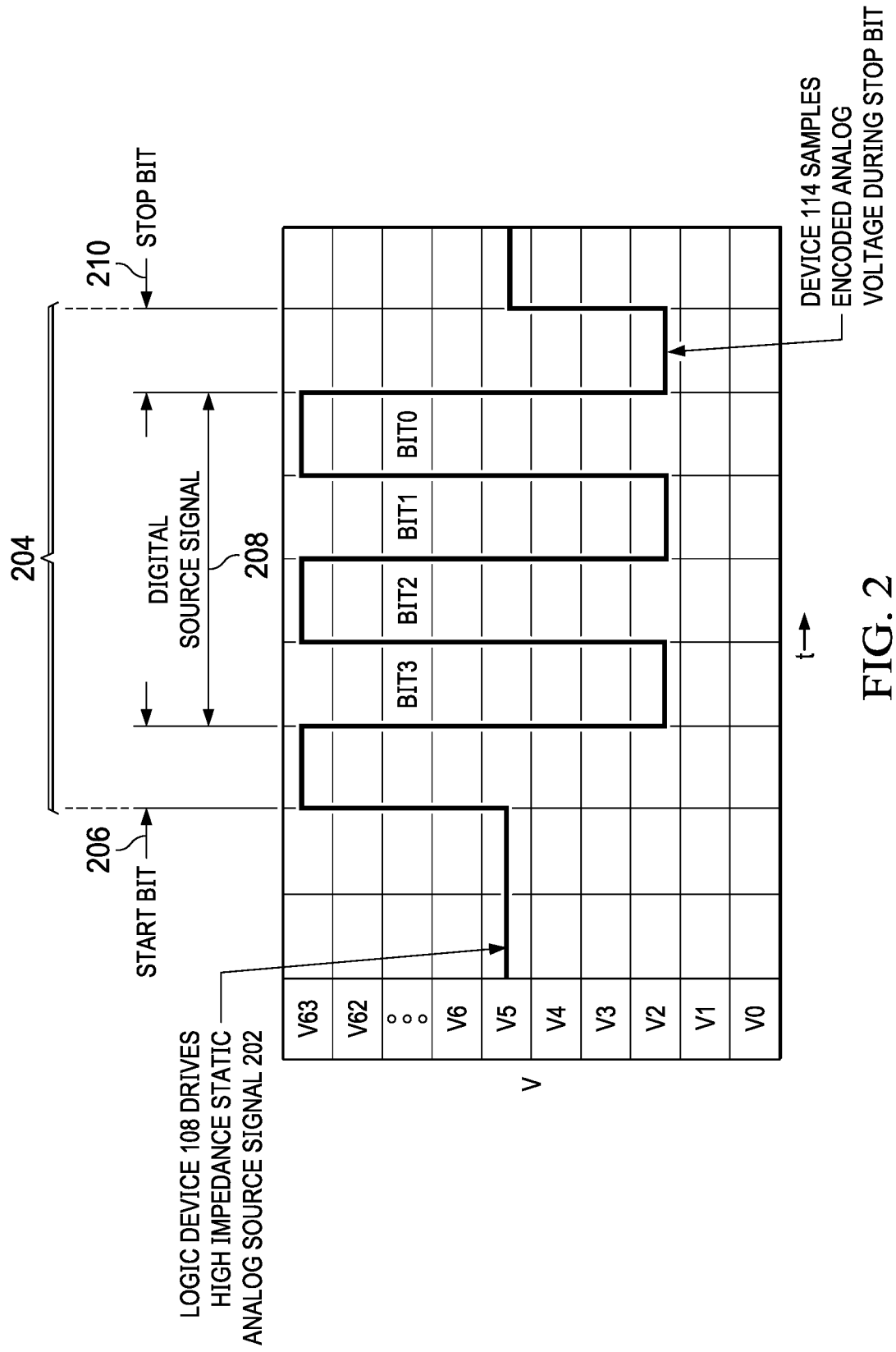
FIG. 2 illustrates an example waveform of source information signaling driven on a source information wire by a logic device, in accordance with embodiments of the present disclosure.
Figure 3:
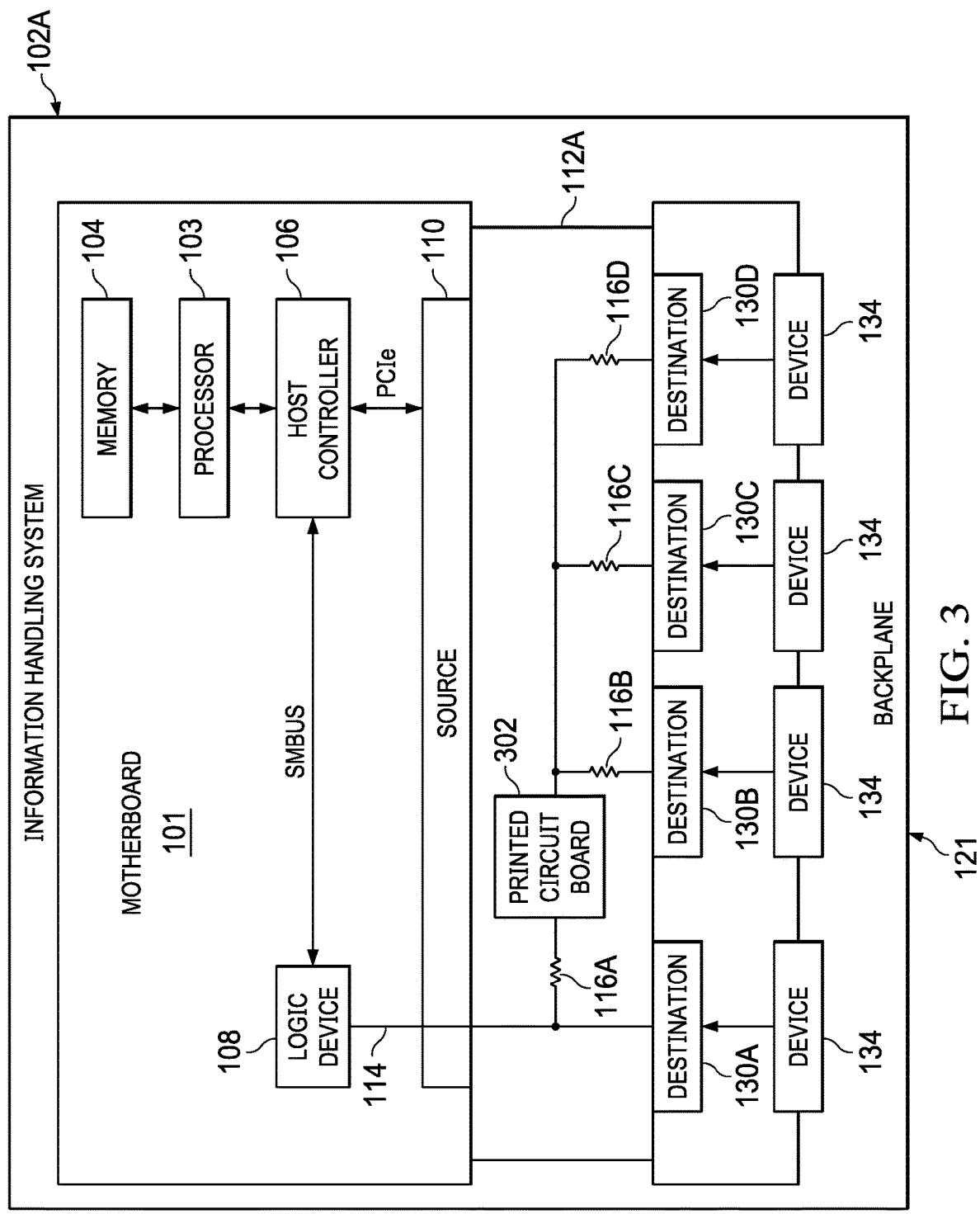
FIG. 3 illustrates a block diagram of another example information handling system, in accordance with embodiments of the present disclosure.

Preferred embodiments and their advantages are best understood by reference to FIGS. 1 through 3 wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may comprise or be an integral part of a server. In other embodiments, information handling system 102 may be a personal computer. In these and other embodiments, information handling system 102 may be a portable information handling system (e.g., a laptop, notebook, tablet, handheld, smart phone, personal digital assistant, etc.). As depicted in FIG. 1, information handling system 102 may include a motherboard 101, and a backplane 121 communicatively coupled to motherboard 101 via a cable 112.

Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include processor 103, a memory 104 communicatively coupled to processor 103, a host controller 106 communicatively coupled to processor 103, a logic device 108 communicatively coupled to host controller 106, and a source 110 communicatively coupled to host controller 106 and logic device 108.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off. Although memory 104 is depicted in FIG. 1 as integral to motherboard 101, in some embodiments, all or a portion of memory 104 may reside external to motherboard 101.

Host controller 106 may be any system, device, or apparatus configured to control certain data paths (e.g., data flow between processor 103, memory 104, and peripherals) and support certain functions of processor 103. Host controller 106 may also be known as a "chipset" or "platform controller hub" of information handling system 102. One such function of host controller 106 may include remote out-of-band management for information handling system 102 in order to monitor, maintain, update, upgrade, and/or repair information handling system 102. In some embodiments, such hardware and firmware may be compliant with Intel's Active Management Technology.

Logic device 108 may comprise any system, device, or apparatus configured to, as described in greater detail below, transmit source information via source information wire 114 of cable 112 to a plurality of destinations 130A on backplane 121 via a plurality of branches of cable 112. As shown in FIG. 1, logic device 108 may be communicatively coupled to host controller 106 via a System Management Bus (SMBus) or other suitable communications topology. In some embodiments, logic device 108 may comprise a complex programmable logic device.

Source 110 may comprise any system, device, or apparatus configured to serve as a cable interface for cable 112 to communicate data between host controller 106 and cable 112 (e.g., via PCIe) and information from logic device 108 to cable 112 on source information wire 114. Accordingly, source 110 may comprise a suitable connector or receptacle for receiving cable 112.

Cable 112 may comprise a plurality of electrically-isolated wires and may be terminated at each end with connectors or other terminations configured to electrically and mechanically couple to source 110 and destinations 130. In some embodiments, cable 112 may comprise a single-source/multiple destination cable having multiple branches. As shown in FIG. 1, each branch of cable 112 may include a series resistor 116 (e.g., resistor 116A, 116B, 116C, 116D) that enables identification of a lane start/offset and width at a destination 130. Each resistor 116A, 116B, 116C, and 116D may have a different resistance. Although for the purposes of clarity and exposition, cable 112 is shown in FIG. 1 as having four branches, cable 112 may include any suitable number of branches. Further, for the purposes of clarity and exposition, FIG. 1 does not show actual communication lanes and communication wires for communication of data between host controller 106 and destinations 130.

Backplane 121 may comprise any system, device, or apparatus (e.g., a printed circuit board) configured to provide power and/or signals (e.g., data and sideband signals) to each of one or more devices 134 received at corresponding connectors (e.g., receptacle connectors) of backplane 121, such connectors configured to mechanically and electrically couple devices 134 to electrically conductive pathways of backplane 121. As shown in FIG. 1, backplane 121 may include a plurality of destinations 130 (e.g., destinations 130A, 130B, 130C, and 130D), each destination associated with a corresponding device 134.

Each destination 130 may comprise any system, device, or apparatus configured to serve as a cable interface for cable 112 in order to communicate data between devices 134 and cable 112. Accordingly, each destination 130 may comprise a suitable connector or receptacle for receiving cable 112.

Each device 134 may comprise any suitable input/output device configured to communicate with processor 103, and may in some embodiments comprise one or more storage resources for storing data. For example, in some embodiments, devices 134 may comprise an NVMe storage device or other solid state drive. For purposes of exposition, four devices 134 are shown populated in backplane 121. However, backplane 121 may include any suitable number of connectors for receiving devices 134, and at any time, none, some, or all of such connectors may be populated with corresponding devices 134. In some embodiments, each device 134 may include a processing unit, such as a microcontroller unit (MCU) for performing some or all of the functionality of such device 134.

FIG. 2 illustrates an example waveform of source information signaling driven on source information wire 114 by logic device 108, in accordance with embodiments of the present disclosure. As shown in FIG. 2, in operation, upon initiation of logic device 108, logic device 108 may begin by tri-stating source information wire 114 to drive a high-impedance static analog source signal 202 on source information wire 114 to identify source 110, in accordance with existing approaches to communicating analog source information. Such analog source signal 202 may be sampled by backplane 121 (e.g., such as a microcontroller unit, now shown) and used to identify source 110 to backplane 121. In the example shown in FIG. 2, the static voltage level of analog source signal 202 is in the voltage range V5, which for example, in a system with eight possible sources labeled 0 through 7, may identify source 110 as the source labeled 5.

In the event that a destination device 134 supports digital source identification (e.g., based on communication from a destination device 134 to source 110 in discovery information for the destination device, not shown), logic device 108 may communicate a digital source identifier frame 204 comprising a start bit 206 (e.g., driven high to indicate start of digital source identifier frame 204), a digital source signal 208, and a stop bit 210 (e.g., driven low to indicate end of digital source identifier frame 204). Digital source signal 208 may include a digital nibble, byte, word, or other datagram which is the digital equivalent of the label of source 110 identified by analog source signal 202 (e.g., 0101=5, in the example shown in FIG. 2).

Furthermore, as shown in FIG. 2, due to series resistors 116 each having a different resistance, logic device 108 may drive stop bit 210 to an encoded analog voltage which may be sampled by device 134 and may include analog-encoded start/offset and/or width information regarding communication lanes associated with the particular branch of cable 112 to which a device 134 is coupled. For example, in a particular embodiment, possible analog voltages for stop bit 210 may be encoded as follows:

V0: Lane 0, Full width of source 110 (i.e., point-to-point, no branches)
V1: Lane 0, One-half width of source 110
V2: Lane 0, One-fourth width of source 110
V3: Lane 0, One-eighth width of source 110
V4: Lane 2, One-half width of source 110
V5: Lane 2, One-fourth width of source 110
V6: Lane 2, One-eight width of source 110

Thus, in the particular embodiment shown in FIG. 2, the analog voltage of V2 indicates that the branch to which the particular device 134 is coupled corresponds to Lane 0 of a PCIe connection which is one-fourth the width of source 110 (e.g., x4 if source 110 is x16).

Thus, the systems and methods disclosed herein support a shared source information wire 114 to communicate both analog and digital source information, in addition to supporting a single source information wire 114 capable of communicating both analog and digital information to multiple branch destinations of cable 112. In addition, the systems and methods disclosed herein support an ability for a destination device 134 to advertise support for digital source information and then receive both analog and digital information on the same wire in order to enable backward compatibility with existing devices that do not support digital source information.

FIG. 3 illustrates a block diagram of another example information handling system 102A, in accordance with embodiments of the present disclosure. Information handling system 102A shown in FIG. 3 in similar in many respects to information handling system 102 shown in FIG. 1, and thus only the main difference between information handling system 102 and information handling system 102A may be described below.

A key difference between information handling system 102 and information handling system 102A may that cable 112A is used in lieu of cable 112, and cable 112A may include a self-describing cable comprising a printed circuit board 302, such as that described in U.S. patent application Ser. No. 17/124,774, filed Dec. 17, 2020, and incorporated by reference herein in its entirety. In such an embodiment, printed circuit board 302 may sample static analog source signal 202 and drive digital source identifier frame 204, including digital source signal 208 and analog-encoded start/offset and/or width information of stop bit 210 to destinations 130.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a plurality of communication destinations;
   a communication source;
   a single-source/multi-destination cable having a plurality of branches, each branch communicatively coupling the communication source to a communication destination respective to such branch; and
   a logic device communicatively coupled to the communication source and the single-source/multi-destination cable and configured to drive a source information signal communicated to each of the plurality of branches, wherein the source information signal comprises, during a first interval, an analog signal indicative of a particular communication source and, during a second interval, a digital signal indicative of the particular communication source.

2. The information handling system of claim 1, wherein the digital signal comprises a digital source identifier frame identifying the communication source to at least one of the plurality of communication destinations.

3. The information handling system of claim 1, wherein the analog signal comprises an analog voltage identifying the communication source to at least one of the plurality of communication destinations.

4. The information handling system of claim 3, wherein the digital signal comprises a digital source identifier frame identifying the communication source to at least one of the plurality of communication destinations, wherein the digital source identifier frame comprises a digital datagram which is a digital equivalent to the analog voltage.

5. The information handling system of claim 1, wherein the analog signal comprises at least one of start/offset information and width information regarding a branch of the single-source/multi-destination cable.

6. The information handling system of claim 5, wherein the digital signal comprises a digital source identifier frame identifying the communication source to at least one of the plurality of communication destinations, wherein an analog voltage associated with a bit of the digital source identifier frame encodes the at least one of start/offset information and width information.

7. The information handling system of claim 6, wherein:
   each branch of the single-source/multi-destination cable comprises a series resistance different from series resistances of other branches; and
   the analog voltage that encodes the at least one of start/offset information and width information is a function of one or more of the series resistances of the branches.

8. A method comprising, in an information handling system having a plurality of communication destinations, a communication source, and a single-source/multi-destination cable having a plurality of branches, each branch communicatively coupling the communication source to a communication destination respective to such branch:
   driving a source information signal communicated to each of the plurality of branches, wherein the source information signal comprises, during a first interval, an analog signal indicative of a particular communication source and, during a second interval, a digital signal indicative of the particular communication source.

9. The method of claim 8, wherein the digital signal comprises a digital source identifier frame identifying the communication source to at least one of the plurality of communication destinations.

10. The method of claim 8, wherein the analog signal comprises an analog voltage identifying the communication source to at least one of the plurality of communication destinations.

11. The method of claim 10, wherein the digital signal comprises a digital source identifier frame identifying the communication source to at least one of the plurality of communication destinations, wherein the digital source identifier frame comprises a digital datagram which is a digital equivalent to the analog voltage.

12. The method of claim 8, wherein the analog signal comprises at least one of start/offset information and width information regarding a branch of the single-source/multi-destination cable.

13. The method of claim 12, wherein the digital signal comprises a digital source identifier frame identifying the communication source to at least one of the plurality of communication destinations, wherein an analog voltage associated with a bit of the digital source identifier frame encodes the at least one of start/offset information and width information.

14. The method of claim 13, wherein:
   each branch of the single-source/multi-destination cable comprises a series resistance different from series resistances of other branches; and
   the analog voltage that encodes the at least one of start/offset information and width information is a function of one or more of the series resistances of the branches.

15. An article of manufacture comprising:
   a non-transitory computer-readable medium; and
   computer-executable instructions carried on the computer-readable medium, the instructions readable by a processing device, the instructions, when read and executed, for causing the processing device to, in an information handling system having a plurality of communication destinations, a communication source, and a single-source/multi-destination cable having a plurality of branches, each branch communicatively coupling the communication source to a communication destination respective to such branch:
   drive a source information signal communicated to each of the plurality of branches, wherein the source information signal comprises, during a first interval, an analog signal indicative of a particular communication source and, during a second interval, a digital signal indicative of the particular communication source.

16. The article of claim 15, wherein the digital signal comprises a digital source identifier frame identifying the communication source to at least one of the plurality of communication destinations.

17. The article of claim 15, wherein the analog signal comprises an analog voltage identifying the communication source to at least one of the plurality of communication destinations.

18. The article of claim 17, wherein the digital signal comprises a digital source identifier frame identifying the communication source to at least one of the plurality of communication destinations, wherein the digital source identifier frame comprises a digital datagram which is a digital equivalent to the analog voltage.

19. The article of claim 14, wherein the analog signal comprises at least one of start/offset information and width information regarding a branch of the single-source/multi-destination cable.

20. The article of claim 19, wherein the digital signal comprises a digital source identifier frame identifying the communication source to at least one of the plurality of communication destinations, wherein an analog voltage associated with a bit of the digital source identifier frame encodes the at least one of start/offset information and width information.

21. The article of claim 20, wherein:
   each branch of the single-source/multi-destination cable comprises a series resistance different from series resistances of other branches; and
   the analog voltage that encodes the at least one of start/offset information and width information is a function of one or more of the series resistances of the branches.

* * * * *